United States Patent
Nguyen et al.

(10) Patent No.: US 10,468,585 B1
(45) Date of Patent: Nov. 5, 2019

(54) DUAL FUNCTION MAGNETIC TUNNEL JUNCTION PILLAR ENCAPSULATION

(71) Applicant: International Business Machines Corporation, Armonk, NY (US)

(72) Inventors: Son V. Nguyen, Schenectady, NY (US); Alexander Reznicek, Troy, NY (US); Donald F. Canaperi, Bridgewater, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/994,662

(22) Filed: May 31, 2018

(51) Int. Cl.
   *H01L 43/02* (2006.01)
   *H01L 43/12* (2006.01)
   *H01L 43/08* (2006.01)
   *H01L 27/22* (2006.01)

(52) U.S. Cl.
   CPC ........... *H01L 43/02* (2013.01); *H01L 27/222* (2013.01); *H01L 43/08* (2013.01); *H01L 43/12* (2013.01)

(58) Field of Classification Search
   CPC .. H01F 10/324; H01F 10/3281; H01F 41/303; H01F 41/32; H03M 2201/818
   See application file for complete search history.

(56) References Cited

U.S. PATENT DOCUMENTS

| 9,117,995 | B2 | 8/2015 | Daibu et al. |
| 9,853,087 | B2 | 12/2017 | Suh et al. |
| 2015/0214157 | A1 | 7/2015 | Canaperi et al. |
| 2015/0372225 | A1 | 12/2015 | Gaidis et al. |
| 2017/0092847 | A1 | 3/2017 | Kim et al. |
| 2017/0125668 | A1* | 5/2017 | Paranjpe ................. H01L 43/12 |
| 2017/0271579 | A1 | 9/2017 | Kim |
| 2017/0301857 | A1* | 10/2017 | Mudivarthi ............. H01L 43/12 |
| 2018/0033957 | A1 | 2/2018 | Zhang et al. |
| 2019/0013354 | A1* | 1/2019 | Lee ....................... H01L 23/528 |

FOREIGN PATENT DOCUMENTS

| JP | 2013-143548 | 7/2013 |
| KR | 2006-0008166 | 1/2006 |

OTHER PUBLICATIONS

Au, Yeung et al., Selective Chemical Vapor Deposition of Manganese Self-Aligned Capping Layer for Cu Interconnections in Microelectronics, Journal of the Electrochemical Society, 157, Apr. 26, 2010, pp. D341-D345, US.

Nguyen, Son, et al. "Lightly porous SiCOH 2.7 dielectric film development for 65/45/32 nm advanced nanoelectronic CMOS devices." Meeting Abstracts. No. 28. The Electrochemical Society, 2008., p. 1, Abstract #2076.

* cited by examiner

Primary Examiner — Zandra V Smith
Assistant Examiner — Andre C Stevenson
(74) Attorney, Agent, or Firm — L. Jeffrey Kelly; Otterstedt, Wallace & Kammer, LLP

(57) ABSTRACT

Magnetic tunnel junction pillars are encapsulated by an oxidized diffusion barrier layer. Oxygen within the encapsulating material is used to oxidize metallic residue outside the pillars, converting the residue to a non-conductive material such as a metal oxide or metal oxynitride. Selective deposition of manganese on the metal layers of the pillars can be followed by oxidation of the manganese to form a manganese oxide diffusion barrier. Alternatively, manganese deposition can be followed by deposition of silicon dioxide and subsequent annealing to form a manganese silicate diffusion barrier.

20 Claims, 4 Drawing Sheets

DUAL FUNCTION MAGNETIC TUNNEL JUNCTION PILLAR ENCAPSULATION

BACKGROUND

The present invention relates generally to the electrical, electronic and computer arts and, more particularly, to the encapsulation of magnetic tunnel junction (MTJ) pillars.

Magnetic tunnel junction stacks are suitable for use in various electronic applications, including non-volatile memory devices and magnetic field sensors. Magnetic random access memory (MRAM) can, for example, offer faster operational speed than flash memory. MRAM devices may be able to replace dynamic random access memory (DRAM) devices in some applications.

Magnetic tunnel junctions include two magnetic layers and a tunnel barrier layer positioned between the magnetic layers. The magnetic layers can be characterized as "reference" and "free" layers, respectively while the tunnel barrier can be a thin tunneling oxide layer. The magnetization direction of one layer of the junction is fixed so that it serves as the reference layer. The magnetization of the free layer can be determined by an electrical input. A MTJ includes two stable resistance states. Charge current from the reference layer to the free layer causes the MTJ to switch between states by overcoming the energy barrier.

MJT fabrication to form an MRAM bit can be challenging. One challenge relates to formation of MTJ pillars using etching techniques that can leave metallic residues on the pillars. Such residues may cause electrical shorts across the tunnel barriers or otherwise compromise device performance. Ion beam etching (IBE) allows the etching of stacks of multiple materials where the vapor pressure of the materials to be removed is negligible, but can leave metallic residues that adversely affect performance. Oxidation of the metallic residue in air following IBE is difficult to control due, in part, to the non-uniform sizes of the residue on the MTJ pillars. For IBE processing of MTJ pillars, the amount and size of residues is a function of the etch pattern density and the etch depth. Overall magnetic response, device performance and process repeatability may be adversely impacted using conventional oxidation of the metallic residue.

BRIEF SUMMARY

A pillar encapsulation method includes obtaining a pillar having sidewalls and including a magnetic tunnel junction. A metal layer is selectively deposited on the sidewalls of the pillar. An oxidized diffusion barrier layer is formed on the sidewalls of the pillar from the metal layer.

A method of forming a pillar including a magnetic tunnel junction and a diffusion barrier layer on the pillar includes providing a blanket structure including metal layers and a tunnel barrier layer and subjecting the blanket structure to ion beam etching to obtain a pillar including a magnetic tunnel junction, the pillar further including vertically extending sidewalls and metallic residue on the sidewalls. A diffusion barrier layer is formed on the sidewalls of the pillar by depositing a metal compound including oxygen on the pillar. The metallic residue is oxidized using the oxygen within the metal compound.

An electronic structure includes a pillar having sidewalls, a vertical stack of metal layers, and a magnetic tunnel junction comprising a plurality of the metal layers and a tunnel barrier layer. A diffusion barrier layer is on the sidewalls of the pillar, the diffusion barrier being comprised of a compound including manganese and oxygen. Metal oxide or metal oxynitride residue adjoins the sidewalls of the pillar and is encapsulated by the diffusion barrier layer.

Techniques and structures as disclosed herein can provide substantial beneficial technical effects. By way of example only and without limitation, one or more embodiments may provide one or more of the following advantages:

Oxidation of metallic residue in a controlled manner;
  Prevention of electrical shorts in MTJ stacks while forming a dielectric barrier;
  Thin diffusion/oxidation barrier enabling functional nano-MTJ device fabrication;
  Self-alignment of diffusion barrier;
  Allows IBE for MTJ pillar formation;
  Allows thinner encapsulation film with lower k dielectric that will improve device performance;
  Enables encapsulation film with strong oxygen scavenger element providing robust encapsulation and oxygen barrier properties.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Silicon-based devices typically include multiple interconnect metallization layers above a device (front-end-of-line/

FEOL) layer that contains field-effect transistors (FETs) or other structures. Middle-of-line (MOL) processing includes steps typically used for fabricating metal contacts for logic circuitry components such as field-effect transistors (FETs), resistors, diodes, and capacitors. Back-end-of-line (BEOL) processing involves the creation of metal interconnecting wires that connect the devices formed in FEOL processing to form electrical circuits. The metal lines including the interconnecting wires are deposited in sequence (e.g. M1, M2, M3, etc.) above the FEOL layer and include dielectric layers comprising trenches and vias therein that are filled with electrical conductors. Trench openings are conventionally formed in the dielectric layer by using, for example, known damascene or dual damascene techniques. M2 and M3 lines may have wider pitches than the M1 line. The interconnecting wires within each metal line are electrically connected to interconnecting wires in other metal lines and to the devices in the FEOL layer.

Figure 1:
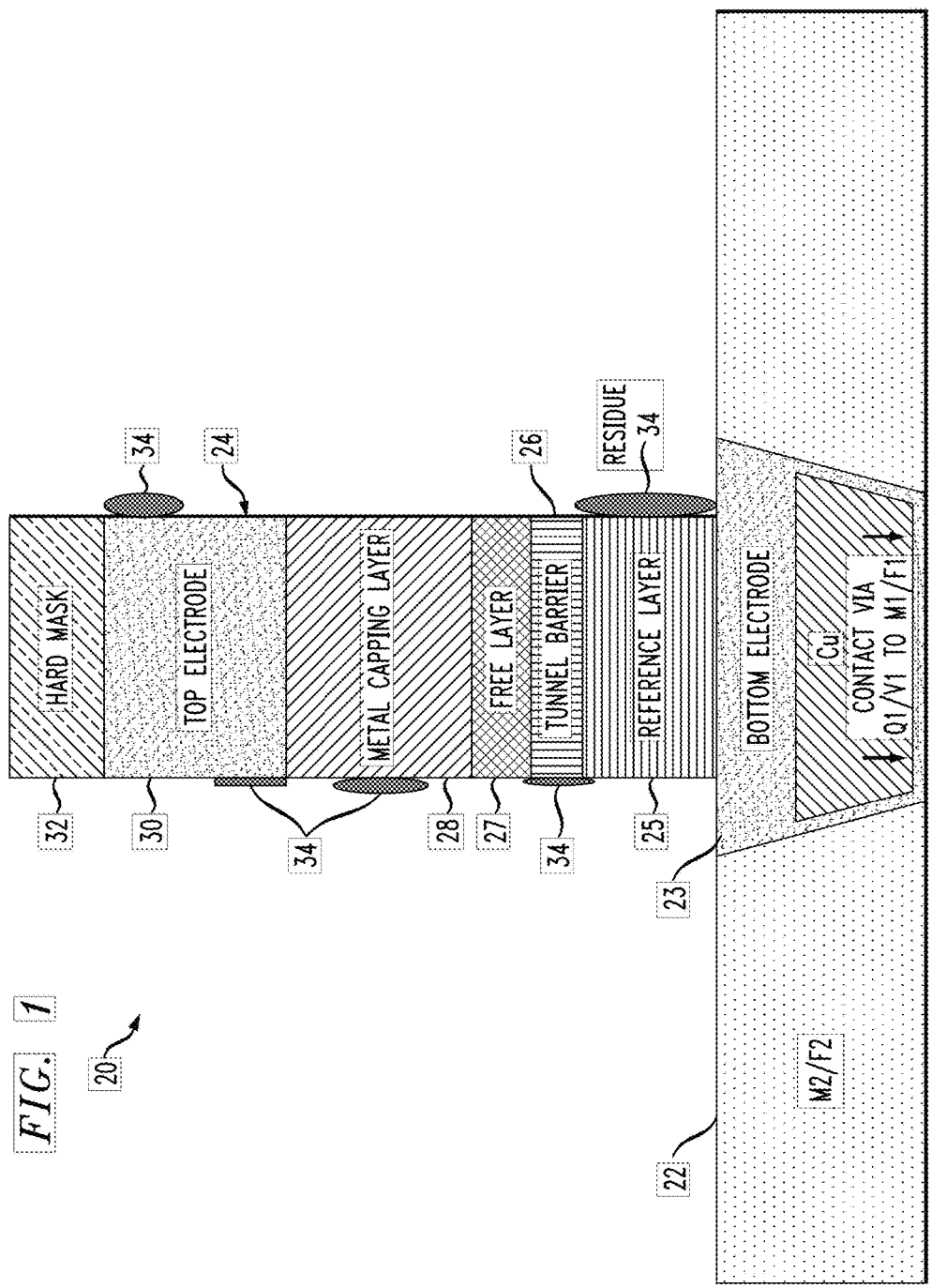
FIG. 1 is a schematic, cross-sectional view showing an exemplary MTJ stack following ion beam etching.

Access times and overall circuit performance can be potentially obtained by integrating memory devices close to the FEOL layer rather than in special sections on a chip. An MRAM is one type of memory device that can be integrated with BEOL CMOS processing just above the FEOL layer, for example between the M2 and M3 lines or layers. A monolithic structure 20 shown in FIG. 1 is obtained following FEOL processing and between metal lines M2 and M3 (not shown). MTJ stack films can be deposited using, for example, physical vapor deposition (PVD) or ion beam deposition (IBD). The tunnel barrier can be formed by oxidizing a metal layer without oxidizing the underlying reference layer. The patterning of the MTJ stack films to form pillars, one of which is shown in FIG. 1, is accomplished by a stack etching process. Ion milling (ion beam etching or IBE) is an effective MTJ stack etching technique, though the etched material often tends to stick to the etched elements of the stack and the mask sidewalls.

Referring again to the exemplary structure 20 shown in FIG. 1, an MTJ stack is shown following deposition and patterning of a hard mask and ion beam etching of an MTJ stack film deposited on an M2/F2 (Metal 2/Fatwire dielectric 2) layer 22. An SiCOH dielectric film having a dielectric constant (k) of about 2.7-2.8 can be employed in forming the M2/F2 layer. Such a dielectric film can be deposited using PECVD. The etching of the MTJ stack film results in the formation of vertical pillars 24 from the stack film, each of the pillars including a magnetic tunnel junction comprised of a tunnel barrier layer 26 between a reference layer 25 and a free layer 27. Aluminum oxide and magnesium oxide are among the compounds that may form the tunnel barrier layer. The free layer 27 may be formed of magnetically active metal such as Fe and/or Co, FeCoB, and combinations thereof as well as other interlayers known in the art, and may comprise multiple layers. The reference layer 25 adjoins a bottom electrode 23 formed within the electrically insulating (ILD) interlayer 22 and may comprise multiple layers, including a pinning layer, ferromagnetic layers and a spacer layer between the ferromagnetic layers. The interlayer 22 may, for example, be formed from silicon oxide or a low-k dielectric material such as SiCOH as described above and include multiple dielectric sub-layers. Chemical vapor deposition (CVD), including plasma-enhanced CVD, may be used for the deposition of low-k (k less than 4.0) dielectric materials such as porous SiCOH). The bottom electrode is electrically connected to a metal contact via Q1/V1 (not shown) which is, in turn, electrically connected to the M1/F1 layer (not shown). A metal capping layer 28 adjoins the top surface of the free layer of the exemplary pillar 24. A top electrode layer 30 adjoins the top surface of the metal capping layer. Dielectric caps 32 formed from the hard mask adjoin the top surfaces of the top electrode layers 30 of the pillars. The dielectric caps may comprise silicon nitride or other composition suitable for ion beam etching of the MTJ stack film. It will be appreciated that the techniques disclosed herein are applicable to the fabrication of MTJ-containing pillars having various configurations and made from materials other than those described with respect to the exemplary pillar described above.

The structure 20 includes metallic residue 34 on various layers of the pillar following the ion beam etch. The residue 34 shown in FIG. 1, like the layers of the pillar 24, is not drawn to scale. The residue may include different metals or metal nitride compounds corresponding to the metals within the MTJ stack film.

In accordance with one exemplary process, a metal layer such as manganese (not shown) is selectively deposited on the metal layers of each pillar 24 immediately following pillar formation. The chosen metal should be amenable to oxidation on the pillar to form a metal oxide or a metal silicate diffusion barrier, as discussed further below. The metal layer covers the exposed sidewalls of the pillar and the residue 34 formed on the pillar sidewalls.

In an exemplary embodiment, a manganese layer is deposited on the pillars 24 using a selective deposition process. An evaporative process may be employed for selective manganese deposition. A typical manganese evaporation process includes heating manganese in an electrically heated crucible to 1300-1500° C. at 1-20 millitorrs. A selective chemical vapor deposition (CVD) of manganese on the metal layers of the pillars may be employed. A bis(N,N'-diisopropylpentylamidinato) manganese(II) precursor may be evaporated from liquid in a bubbler into a flow of purified nitrogen and mixed with purified hydrogen before entering a reactor. The reactor temperature is controlled at 300° C. Deposition of manganese on dielectric surfaces, such as portions of the top surface of the M2/F2 layer, is avoided by exposure to vapors including reactive alkylsilyl groups.

In an exemplary process, selective Mn deposition was implemented in a chemical vapor deposition (CVD) reactor using bis(N,N'-diisopropylpentylamidinato) manganese(H) precursor s at 300° C. For the selective deposition of Mn on a metal/SiCOH patterned surfaces, the oxidized metal was first reduced in hydrogen gas at 250° C. and then a self-assembled monolayer (SAM) of molecules such as N,N-Dimethyltrimethylsilylamine ($C_5H_{15}NSi$) and/or bis(dimethylamino)dimethylsilane ($C_6H_{18}N_2Si$) formed to passivate/bond to the SiCOH surface only at 90° C. and block the Mn deposition. The manganese is then deposited on the metal surfaces using bis(N,N'-diisopropylpentylamidinato) manganese(II) precursors at 300° C. A manganese layer having a thickness between 0.5-25 nm, preferably about 2-10 nm, is deposited in one or more embodiments. The resulting structure may then be annealed at 350° C. in oxygen, nitrous oxide or ambient for one to ten minutes depending on the film's thickness to form MnO from the deposited manganese layer.

Figure 2:
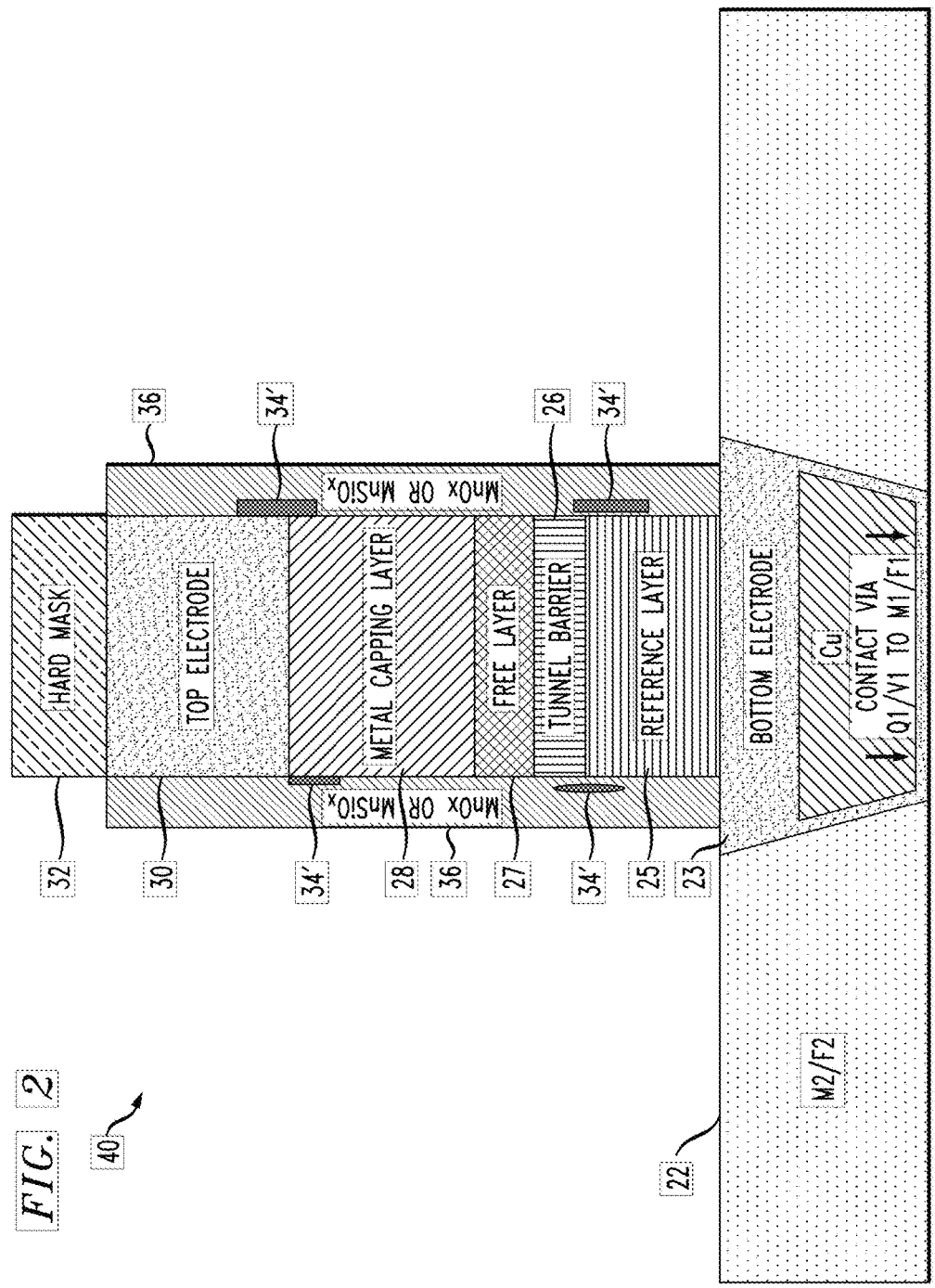
FIG. 2 is a schematic, cross-sectional view showing an exemplary MTJ stack following selective deposition of manganese (Mn) and silicon oxide on the stack followed by oxidation of the deposited metal and metallic residue on the stack.

In another alternative scheme, porous SiOx film can deposited on top of Mn/MnOx and then annealed in the same ambient to for MnSiOx. The oxidation of the manganese layer also causes the oxidation of the residue on the pillar sidewalls. By oxidizing the residue with the oxygen within the metal oxide compound encapsulating the metal layers of the pillars, the pillars are cleaned from electrical shorts caused by the residue. The oxidized manganese and oxidized residue 34' additionally form an effective self-aligned diffusion barrier 36 on the sidewalls of the pillar. A $MnO_x$ barrier layer having a thickness of 1.2-2 nm is sufficient to provide a copper diffusion/oxidation barrier for the MTJ pillar and enable nano-MTJ device fabrication. For process robustness a thin SiN or MnN layer of 5-10 nm thick can also be deposited to ensure a larger process window. Greater thicknesses of manganese oxide may be employed. FIG. 2 schematically illustrates a structure 40 including a MTJ pillar encapsulated by a $MnO_x$ (or $MnSiO_x$) barrier 36. It will be appreciated that manganese can be oxidized using any suitable method that also causes oxidation of the residue. Plasma oxidation may alternatively be employed for shorter thermal exposure to the MTJ instead of thermal annealing at 350° C. in 1-15 minutes. Manganese can be oxidized with plasma oxidation $O_2$ or $N_2O$ plasma at 100° C. to 300° C. for 1-2 seconds and/or then, as needed, annealed in oxygen/nitrous oxide or ambient air for another 10-20 seconds at the same temperature. In both cases oxidation time will depend on film thickness and temperature, with 1-20 seconds being an exemplary time frame. As mentioned before, a silicon oxide layer or a manganese nitride (MnN) layer may be deposited over the $MnO_x$ barrier layer. The $MnO_x$ barrier layer, by interdiffusion, can form partially or fully into a $MnSiO_x$ or $MnO_xN_x$ barrier layer following such deposition depending on the silicon oxide or MnN thickness.

The manganese oxide or other oxide (e.g. metal silicate or metal oxynitride) compound formed on the pillar serves two purposes. One purpose is to oxidize the metal residue remaining on the pillars 24 following IBE. Another purpose is to function as a barrier layer that prevents diffusion of copper and acts as an oxygen barrier. Manganese oxide can be engineered to function as an oxygen donor or an oxygen scavenger by obtaining a compound with a desired oxygen content. In embodiments wherein $MnO_x$ is either formed or deposited on the pillars 24, the value of x is preferably less than two (2) to function as an oxygen scavenger and serve as an oxygen barrier. In a preferred embodiment, $1.5 < x < 1.0$.

The pillar 24 may, in some embodiments, be encapsulated by an oxidized diffusion barrier comprising oxygen-containing metal compounds other than $MnO_x$ for example $MnSiC-N_yO_x$ or $MnSiO_x$. In embodiments wherein manganese silicate is formed to oxidize the residue 34 on the pillars 24 and to also function as a diffusion barrier, a selective deposition of manganese (Mn) as described above is followed by deposition of a silicon dioxide layer on the manganese layer. The SiOx deposition is non selective but the SiOx will be on top of non-MTJ region and will not impact the MTJ. Silicon dioxide can be deposited using any suitable process, for example chemical vapor deposition (CVD) or plasma-enhanced chemical vapor deposition (PECVD). The thickness of the manganese layer may be between 0.5-10 nm and the thickness of the silicon dioxide layer may be between 0.5-10 nm in some exemplary embodiments. The thickness of the silicon dioxide layer, if employed, is sufficient to allow the formation of a manganese silicate diffusion barrier and the oxidation of the metallic residue 34. Annealing of the resulting structure at 350° C. for approximately one minute will cause the formation of a diffusion barrier 36 including $MnSiO_x$ and oxidized residue 34', as schematically illustrated in FIG. 2. A layer of $MnSiO_x$ having a thickness of about ten nanometers (10 nm) provides a satisfactory diffusion/oxidation barrier that allows subsequent copper wire formation proximal to the pillars 24. The formation of either $MnO_x$ or $MnSiO_x$ on the pillars provides a thin passivation barrier with controlled in situ oxidation properties to transform electrically conductive residue into non-conducting metal oxide and/or metal oxynitride with no more than minimal impact on the MJT. The oxygen level in the oxygen-carrying material, for example $MnO_x$ or $MnSiO_x$, is sufficient to oxidize the relatively small amounts of residue adjoining the MJT stack after IBE in a controlled manner, effectively cleaning the stack of electrical shorts while forming a dielectric diffusion barrier thereon. Ideally, the $SiO_2$ would be be deposited selectively on top of selectively deposited Mn and then heated to form MnSiOx. Currently the selective deposition process technology of $SiO_x$ on top of metal (Mn) process is immature. A further metal layer (M3/F3) (not shown) is formed subsequent to formation of the diffusion barrier layer on the pillars.

The diffusion barrier layer 36 formed on the MJT stack may include a manganese silicate layer that less than ten nanometers in thickness in some embodiments. In such embodiments, a liner may be deposited on the $MnSiO_x$ layer to improve barrier properties. A manganese nitride (MnN) liner having a thickness of one to five nanometers (1-5 nm) may, for example, be employed. Such a liner may be deposited using atomic layer deposition (ALD) or chemical vapor deposition (CVD). The $MnSiO_x$/MnN barrier layer provides an effective oxidation barrier as well as a barrier to copper diffusion. In some embodiments, a 2-3 nm $MnSiO_x$ layer and a 5 nm MnN liner are employed to form the barrier on the MJT stack. In embodiments including an MnN liner, stable phase MnN material such as $Mn_3N_2$ phase or $Mn_4N$ are preferred because the excess Mn will act as an oxygen scavenger and in turn become a good/better oxidation barrier. Other liners such as $TaN_x$ and $TiN_x$ are also feasible but they are generally less effective than MnN due to the lower reactivity of Ti and Ta as compared to Mn toward oxygen.

A further technique for encapsulating MTJ pillars within diffusion/oxidation barriers and oxidizing residue involves the direct deposit of $MnO_x$ or $MnSiO_x$ on the entire structure 20 rather than the selective deposition of Mn as discussed above followed by oxidation thereof. Oxidized barrier material can be deposited using atomic layer deposition (ALD), thereby encapsulating the MTJ pillar 24 and extending over the M2/F2 wiring layer 22. The oxygen in the deposited compound oxidizes the residue 34 on the MTJ stack 24 as described above. Manganese oxide has a plurality empirical formulas, for example MnO, $MnO_2$, $MnO_3$, $Mn_3O_4$ and $Mn_2O_3$. In some embodiments, manganese oxide having a relatively high oxygen content is deposited nearest to the MTJ pillar while a manganese oxide compound having a lower oxygen content is deposited later in the deposition process, forming a graded diffusion barrier. The inner portions of the diffusion barrier layers may ultimately have relatively lower oxygen concentrations once the oxygen therein is used for oxidation of the metallic residue 34. The oxygen content of ALD-deposited $MnSiO_x$ can likewise be graded, with higher oxygen content at least originally in the regions adjoining the pillars 24 where metallic residue requiring oxidation is expected. At least part of the barrier layer should be functional as an oxygen barrier. As discussed above, in embodiments including a $MnO_x$ barrier layer, the value of x should be less than two to provide acceptable oxygen gettering and thereby function as an oxygen barrier. In embodiments wherein $MnSiO_x$ is deposited on the MTJ stack using plasma-enhanced atomic layer deposition, the atomic percent composition of manganese, silicon and oxygen is 12.8%, 28.5% and 58.7%, respectively in some embodiments. The composition of the manganese silicate film adjoining the MJT stack in some embodiments may accordingly be given as $Mn(SiO_2)_2$. It will be appreciated that a $MnSiO_x$ layer as employed herein may not be entirely uniform in composition, nor is such uniformity required. For example, a manganese silicate $(Mn(SiO_2)_2)$ layer as described may have an atomic concentration of manganese ranging between 13.7% and 11.9%, a silicon concentration ranging between 31.2% and 25.9% and an oxygen concentration ranging between 61.2% and 56.2%. Manganese silicate as described herein has a dielectric constant of about 3.7 as compared to 6.8-7.0 for silicon nitride.

Figure 3:
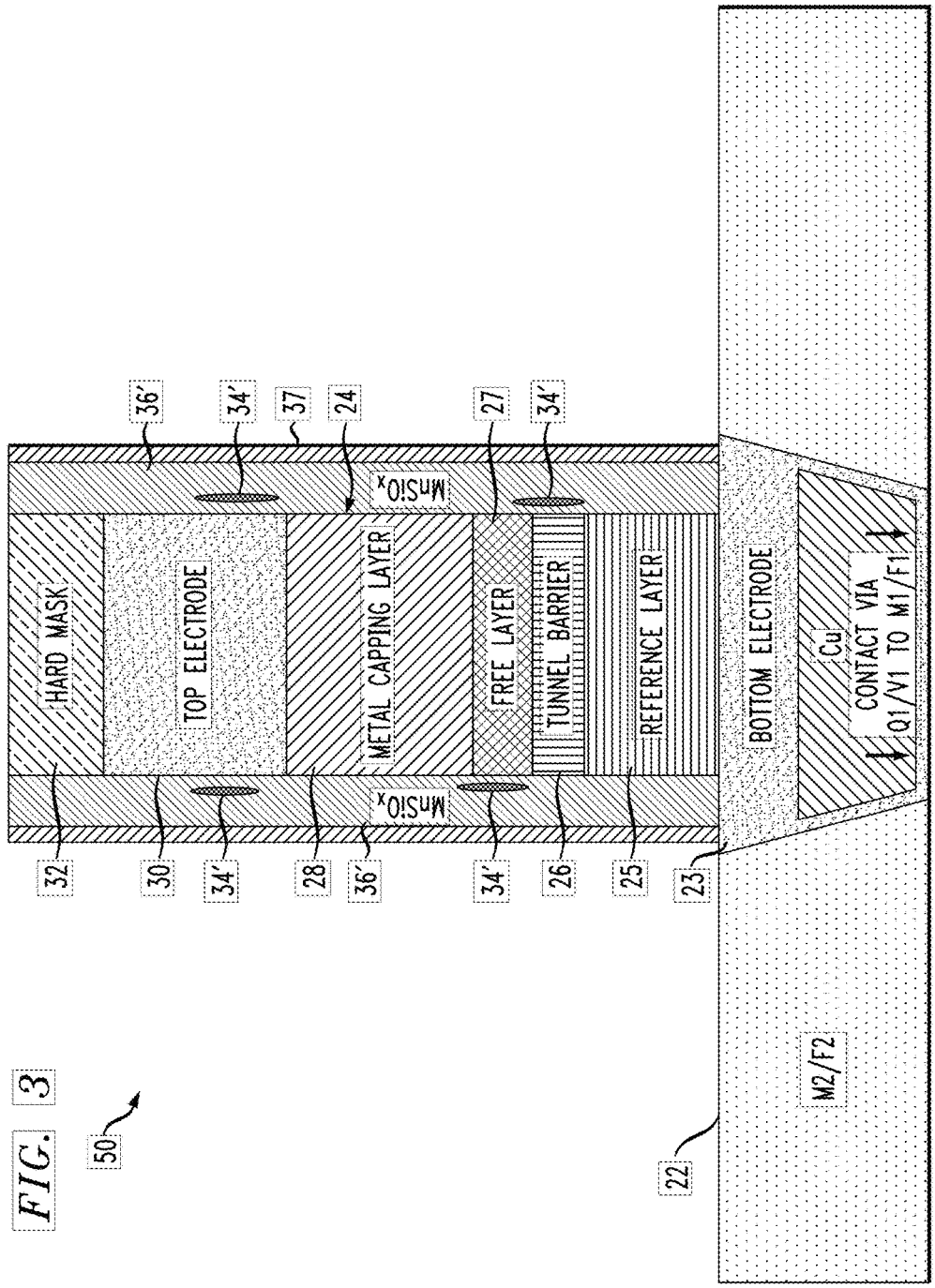
FIG. 3 is a schematic, cross-sectional view showing an exemplary MTJ stack following atomic layer deposition of manganese (Mn) and silicon oxide on the stack followed by oxidation of the deposited metal and metallic residue on the stack.

A structure 50 including an oxidized diffusion barrier 36' conformally deposited using atomic layer deposition and then subjected to a reactive ion etch (RIE) is schematically illustrated in FIG. 3. Diffusion barrier material (e.g. $MnO_x$ or $MnSiO_x$) is removed from the M2/F2 layer 22 using an anisotropic etch which leaves the sidewalls of the pillars 24 protected. The oxidized diffusion barrier material also remains on the sidewalls of the dielectric cap 32 as it is not selectively deposited. The oxidized residue 34', being rendered non-conductive, no longer presents potential electrical shorting issues on the MTJ pillar 24. As discussed above, a thin liner 37 may be deposited on the oxidized diffusion barrier to improve oxygen barrier performance.

Figure 4:
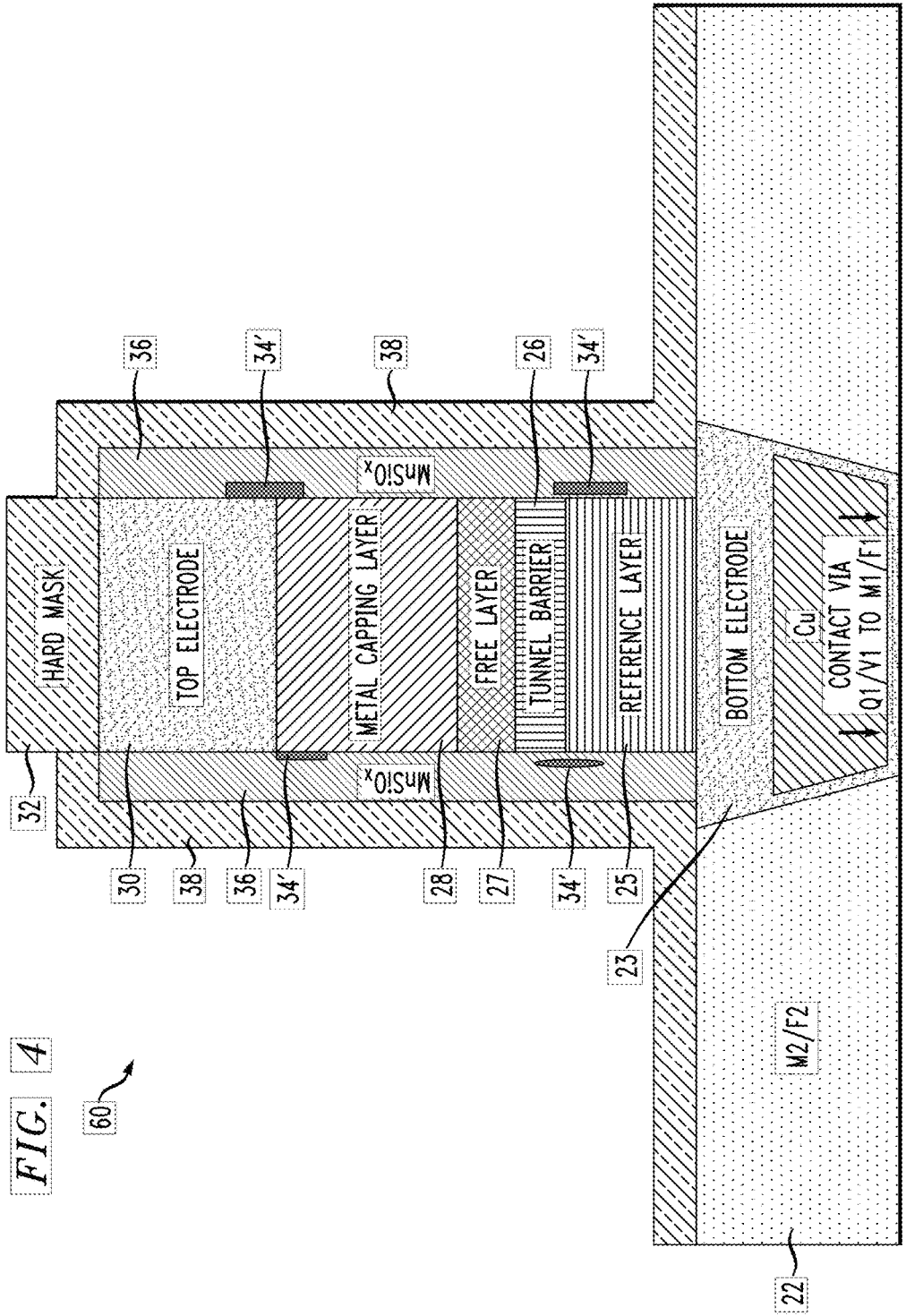
FIG. 4 is a schematic, cross-sectional view showing the structure of FIG. 2 following nitride encapsulation of the stack.

A further structure 60 is schematically illustrated in FIG. 4. The monolithic structure 60 includes an MTJ stack formed on an M2/F2 metallized dielectric layer 22. The magnetic tunnel junction is comprised of a tunnel barrier layer 26 between a reference layer 25 and a free layer 27. The reference layer 25 adjoins a bottom electrode 23 formed within the electrically insulating (ILD) interlayer 22. The bottom electrode is electrically connected to a metal contact via Q1/V1 (not shown) which is, in turn, electrically connected to the M1/F1 layer (not shown). A metal capping layer 28 adjoins the top surface of the free layer of the exemplary pillar 24. The top electrode layer 30 adjoins the top surface of the metal capping layer. A dielectric cap 32 formed from a patterned hard mask adjoins the top surfaces of the top electrode layers 30 of the pillars.

As discussed above, the oxygen-containing layer encapsulating the MTJ stack and used for oxidizing metal residue on the stack following IBE may or may not provide satisfactory barrier properties. A thin metal nitride liner 37 such as MnN is accordingly formed on the oxygen-containing layer in some embodiments, such as shown in FIG. 3. Barrier properties may alternatively be enhanced by encapsulating the pillar and oxygen-containing barrier layer with a silicon nitride layer 38 as schematically illustrated in FIG. 4. In embodiments wherein manganese silicate is employed as the oxidized diffusion barrier layer, the manganese silicate layer only needs to be two to three nanometers in thickness for oxidation of the residue and oxygen gettering. A silicon nitride layer having a thickness of five to six nanometers is sufficient to provide an acceptable copper and oxygen diffusion barrier when employed in conjunction with such a manganese silicate layer. The combined thickness of the two layers (seven to nine nanometers) forming such a diffusion barrier is substantially thinner than the twelve to fifteen nanometer thickness of typical barrier layers consisting only of silicon nitride. The combined manganese silicate/silicon nitride diffusion barrier will also have a lower average dielectric constant (k) than barriers consisting only of silicon nitride. Relatively thin copper/oxygen diffusion barrier layers enable nano-MTJ device fabrication compatible with advanced CMOS scaling.

Diffusion barrier layers comprising $MnO_x$, $MnSiO_x$ and $MnO_xN_x$ as discussed above are compounds usable for effective oxidation of metallic residue on the pillar without adversely affecting the MTJ stack and which thereafter can function as diffusion barriers to protect against oxidation of the layers of the pillar. $MnSiCN_yO_x$ is a further compound that can also be used for such purposes. Oxides and other oxygen-containing compounds formed from metals other than manganese may have potential for oxidizing residue and thereafter functioning as diffusion barrier layers or portions of such layers on MTJ stacks. As discussed above, the compounds employed for such purposes preferably have dielectric constants below that of silicon nitride and more preferably below that of silicon dioxide. Compounds such as $TaSiO_x$ and $TiSiO_x$ may be employed to form the diffusion barrier rather than $MnSio_x$, though are not preferred in view of their relatively high dielectric constants.

The drawing figures as discussed above depict exemplary processing steps/stages in the fabrication of exemplary structures. Although the overall fabrication methods and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* $1^{st}$ *Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Given the discussion thus far, it will be appreciated that, in general terms, a first exemplary method is provided for forming a diffusion barrier on a pillar including a magnetic tunnel junction. The exemplary method can facilitate oxidation of metallic residue that may be present on the pillar and allows the formation of relatively thin diffusion barriers. The first exemplary method includes obtaining a pillar 24 having sidewalls and including a vertical stack of metal layers and a magnetic tunnel junction. The magnetic tunnel junction includes a plurality of the metal layers 25, 27 ("reference" and "free" layers) and a tunnel barrier layer 26 therebetween. A further metal layer is selectively deposited on the metal layers comprising the sidewalls of the pillar 24. An oxidized diffusion barrier layer 36 is formed on the sidewalls of the pillar from the metal layer. A structure 40 as shown in FIG. 2 may accordingly be obtained. The selectively deposited metal layer consists essentially of manganese in one or more embodiments. In such embodiments, forming the oxidized diffusion barrier layer from the metal layer may further include forming manganese oxide or manganese silicate from the manganese layer. Manganese silicate may be formed by depositing a silicon dioxide layer on the manganese layer and thermally annealing the manganese and silicon dioxide layers to form manganese silicate. In some embodiments such as shown in FIG. 4, the method further includes depositing a dielectric barrier layer 38 such as silicon nitride on the oxidized diffusion barrier layer to prevent re-oxidation of the MTJ stack by oxygen diffusion. The pillar can be formed by depositing blanket structure comprising the metal layers and tunnel barrier layer on a wiring layer including an interlayer dielectric layer, metal wires, and metal contacts and subjecting the blanket structure to ion beam etching. Metallic residue on the sidewalls of pillars can be oxidized using oxygen within the oxidized diffusion barrier layer. In some embodiments, a metal nitride liner such as manganese nitride is deposited on the oxidized diffusion barrier layer to improve barrier properties.

A further method of forming a diffusion barrier on a pillar including a magnetic tunnel junction includes providing a blanket structure including metal layers and a tunnel barrier layer 26 and subjecting the blanket structure to ion beam etching to obtain a pillar 24 including a magnetic tunnel junction, such as shown in FIG. 1. The pillar includes vertically extending sidewalls and metallic residue 34 on the sidewalls. A diffusion barrier layer 36' is formed on the sidewalls of the pillar by depositing a metal compound (for example, $MnO_x$, $MnSiO_x$, $MnSiCN_yO_x$ or $MnO_xN_x$) including oxygen on the pillar. Atomic layer deposition may be employed to deposit the diffusion barrier layer immediately following pillar formation followed by RIE to remove the portions of the deposited layer from an underlying wiring layer. The metallic residue on the pillar is oxidized (34') using the oxygen within the metal compound. A structure 50 as shown in FIG. 3 may be obtained. A dielectric layer (for example, silicon nitride) or a metal nitride liner 37 (for example, manganese nitride) may be deposited on the diffusion barrier layer to enhance barrier properties.

Electronic structures obtained in accordance with the principles of the inventions described herein include a pillar 24 (or array of pillars) including a magnetic tunnel junction and a diffusion barrier layer 36 or 36' on the sidewalls of the pillar. The diffusion barrier layer is comprised of a compound including manganese and oxygen (for example, $MnO_x$, $MnSiO_x$, $MnSiCN_yO_x$ or $MnO_xN_x$). Metal oxide or metal oxynitride residue 34' adjoins the sidewalls of the pillar and is encapsulated by the diffusion barrier layer. A metal nitride liner adjoins the diffusion barrier layer in some embodiments. The combined thickness of the diffusion barrier layer and the metal nitride layer is less than ten nanometers in some embodiments. In other embodiments, a silicon nitride layer adjoins the diffusion barrier layer, as shown in FIG. 4. The diffusion barrier layer beneath the silicon nitride layer has a smaller thickness than the silicon nitride layer in one or more embodiments, the combined thickness of the silicon nitride and diffusion barrier layers being less than ten nanometers in some embodiments. The pillar 24 in one or more embodiments extends from a wiring layer including an interlayer dielectric layer 22, metal wires, and metal contacts 23, the magnetic tunnel junction being electrically connected to the wiring layer.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having structures including magnetic tunnel junctions formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" and "vertical" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b). It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of forming a diffusion barrier on a pillar including a magnetic tunnel junction, comprising:
   providing a blanket structure including reference and free layers and a tunnel barrier layer;
   subjecting the blanket structure to ion beam etching, thereby obtaining a pillar having sidewalls and including a magnetic tunnel junction;
   selectively depositing a metal layer consisting essentially of manganese on the sidewalls of the pillar; and
   forming an oxidized diffusion barrier layer on the sidewalls of the pillar from the metal layer, wherein forming the oxidized diffusion barrier layer further includes forming manganese silicate using the metal layer.

2. The method of claim 1, wherein the reference layer adjoins a bottom electrode, the bottom electrode extending within an electrically insulating interlayer.

3. The method of claim 1, wherein forming the manganese silicate further includes:
   depositing a silicon dioxide layer on the metal layer, and
   thermally annealing the metal layer and the silicon dioxide layer to form the manganese silicate.

4. The method of claim 1, further including:
   depositing a dielectric barrier layer on the oxidized diffusion barrier layer.

5. The method of claim 4, wherein the dielectric barrier layer comprises silicon nitride.

6. The method of claim 1, wherein the sidewalls of the pillar include metallic residue, further including:
   causing oxidation of the metallic residue using oxygen within the oxidized diffusion barrier layer.

7. The method of claim 6, further including:
   depositing a metal nitride layer on the oxidized diffusion barrier layer.

8. The method of claim 1, further including:
   depositing a silicon oxide layer on the metal layer, and
   forming a low-k manganese silicate layer from the metal layer and the silicon oxide layer, the oxidized diffusion barrier layer comprising the low-k manganese silicate layer.

9. An electronic structure comprising:
   a pillar having sidewalls and including:
     a vertical stack of metal layers, and
     a magnetic tunnel junction comprising a plurality of the metal layers and a tunnel barrier layer;
   a wiring layer including an interlayer dielectric layer, metal wires, and metal contacts, the magnetic tunnel junction being electrically connected to the wiring layer;
   a diffusion barrier layer on the sidewalls of the pillar, the diffusion barrier being comprised of a compound including manganese and oxygen and including a region adjoining the sidewalls of the pillar and consisting essentially of manganese silicate, and
   a metal oxide or metal oxynitride residue adjoining the sidewalls of the pillar and encapsulated by the diffusion barrier layer.

10. The electronic structure of claim 9, further including a silicon nitride layer adjoining the region of the diffusion barrier layer that consists essentially of manganese silicate.

11. The electronic structure of claim 9, wherein the diffusion barrier layer further includes a manganese nitride liner.

12. The electronic structure of claim 11, wherein the manganese nitride liner comprises $Mn_3N_2$ or $Mn_4N$.

13. The electronic structure of claim 9, wherein the diffusion barrier layer further includes a titanium nitride or a tantalum nitride liner.

14. The electronic structure of claim 9, wherein the manganese silicate has a composition of $Mn(SiO_2)_2$.

15. The electronic structure of claim 14, wherein the diffusion barrier layer further includes a manganese nitride liner comprising $Mn_3N_2$ or $Mn_4N$.

16. A method of forming a diffusion barrier on a pillar including a magnetic tunnel junction, comprising:
   providing a blanket structure including reference and free layers and a tunnel barrier layer;
   subjecting the blanket structure to ion beam etching, thereby obtaining a pillar having sidewalls including metallic residue thereon and further including a magnetic tunnel junction;
   selectively depositing a manganese layer on the sidewalls of the pillar;
   depositing a silicon oxide layer on the manganese layer; and
   forming an oxidized diffusion barrier layer comprising a low-k manganese silicate layer from the manganese layer and the silicon oxide layer on the sidewalls of the pillar.

17. The method of claim 16, wherein forming the oxidized diffusion barrier layer further includes thermally annealing the manganese layer and the silicon oxide layer.

18. The method of claim 17, wherein forming the oxidized diffusion barrier layer further includes depositing a manganese nitride liner over the low-k manganese silicate layer.

19. The electronic structure of claim 18, wherein the manganese nitride liner comprises $Mn_3N_2$ or $Mn_4N$.

20. The method of claim 17, wherein forming the oxidized diffusion barrier layer further includes depositing a metal nitride layer over the low-k manganese silicate layer.

* * * * *